(12) United States Patent
Kim et al.

(10) Patent No.: US 12,087,554 B2
(45) Date of Patent: Sep. 10, 2024

(54) SUBSTRATE TREATING APPARATUS AND SUBSTRATE TREATING SYSTEM HAVING THE SAME

(71) Applicant: SAMSUNG ELECTRONICS CO., LTD., Suwon-si (KR)

(72) Inventors: Sungyeon Kim, Jeongeup-si (KR); Jungpyo Hong, Gwangmyeong-si (KR); Kwangnam Kim, Suwon-si (KR); Hyungjun Kim, Suwon-si (KR); Jongwoo Sun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 607 days.

(21) Appl. No.: 16/905,018

(22) Filed: Jun. 18, 2020

(65) Prior Publication Data

US 2021/0027993 A1 Jan. 28, 2021

(30) Foreign Application Priority Data

Jul. 24, 2019 (KR) .......................... 10-2019-0089415

(51) Int. Cl.
*H01J 37/32* (2006.01)
*H01L 21/67* (2006.01)

(52) U.S. Cl.
CPC ..... *H01J 37/32495* (2013.01); *H01J 37/3211* (2013.01); *H01J 37/32119* (2013.01);
(Continued)

(58) Field of Classification Search
CPC ............... C23C 16/4404; C23C 16/488; H01J 37/321–32119; H01J 37/32238;
(Continued)

(56) References Cited

U.S. PATENT DOCUMENTS 5,368,710 A * 11/1994 Chen ..................... C23C 16/507
204/192.35
5,779,848 A 7/1998 Aruga
(Continued)

FOREIGN PATENT DOCUMENTS

JP         5578865 B2    8/2014
KR  10-2005-0008855 A   1/2005
(Continued)

OTHER PUBLICATIONS

Communication dated May 23, 2024, issued by the Korean Patent Office in Korean Application No. 10-2019-0089415.

*Primary Examiner* — Benjamin Kendall
(74) *Attorney, Agent, or Firm* — Sughrue Mion, PLLC

(57) ABSTRACT

A substrate treating apparatus, including a process chamber having a bottom portion configured to secure a substrate while a substrate treating process is performed on the substrate; and a dielectric window arranged at an upper portion of the process chamber to define a process space, and including: an insulative body, an antenna disposed on an upper surface of the insulative body, a protection layer disposed on a lower surface of the insulative body, and an etch resistor protruding from at least a portion of the protection layer toward the process space, wherein, based on power being applied to the antenna, a plasma is generated in the process space, and wherein the insulative body is protected from the plasma by the protection layer and the etch resistor.

20 Claims, 11 Drawing Sheets

(52) U.S. Cl.
CPC .... *H01J 37/3244* (2013.01); *H01J 37/32715* (2013.01); *H01J 37/32743* (2013.01); *H01L 21/67069* (2013.01); *H01J 2237/334* (2013.01)

(58) Field of Classification Search
CPC ............ H01J 37/3244; H01J 37/32495; H01J 37/32715; H01J 37/32743; H01J 2237/0268; H01J 2237/334; H01L 21/67069; H01L 21/67167
See application file for complete search history.

(56) References Cited

U.S. PATENT DOCUMENTS

| | | | |
|---|---|---|---|
| 5,904,780 A * | 5/1999 | Tomoyasu | H01J 37/321 |
| | | | 118/723 AN |
| 6,835,581 B2 | 12/2004 | Fitz et al. | |
| 7,273,533 B2 | 9/2007 | Brcka et al. | |
| 7,300,537 B2 | 11/2007 | O'Donnell et al. | |
| 7,673,583 B2 | 3/2010 | Brcka | |
| 7,854,213 B2 | 12/2010 | Brcka | |
| 8,573,151 B2 | 11/2013 | Ohmi et al. | |
| 9,583,369 B2 * | 2/2017 | Sun | C23C 14/0052 |
| 9,786,529 B2 | 10/2017 | Ranish et al. | |
| 9,869,012 B2 | 1/2018 | Sun et al. | |
| 2004/0002221 A1 * | 1/2004 | O'Donnell | H01J 37/32467 |
| | | | 438/710 |
| 2006/0225299 A1 * | 10/2006 | Kim | H01L 21/67772 |
| | | | 34/78 |
| 2007/0012403 A1 * | 1/2007 | Lee | H01J 37/32422 |
| | | | 156/345.49 |
| 2011/0094997 A1 * | 4/2011 | Yamazawa | H01L 21/67069 |
| | | | 216/68 |
| 2011/0265821 A1 | 11/2011 | Tay et al. | |
| 2012/0031560 A1 * | 2/2012 | Koshimizu | H01J 37/3211 |
| | | | 118/723 MP |
| 2013/0256271 A1 * | 10/2013 | Panagopoulos | H01J 37/3211 |
| | | | 156/345.35 |
| 2016/0079040 A1 * | 3/2016 | Park | H01J 37/321 |
| | | | 156/345.1 |
| 2016/0314939 A1 | 10/2016 | Sastri et al. | |
| 2016/0358749 A1 | 12/2016 | Sant | |
| 2018/0174802 A1 | 6/2018 | Lim et al. | |
| 2019/0056532 A1 | 2/2019 | Schwartz | |
| 2019/0056667 A1 | 2/2019 | Schwartz | |

FOREIGN PATENT DOCUMENTS

| | | |
|---|---|---|
| KR | 10-2012-0013201 A | 2/2012 |
| KR | 10-2016-0033700 A | 3/2016 |

* cited by examiner

SUBSTRATE TREATING APPARATUS AND SUBSTRATE TREATING SYSTEM HAVING THE SAME

CROSS-REFERENCE TO RELATED APPLICATION

This application claims priority under 35 U.S.C § 119 to Korean Patent Application No. 10-2019-0089415 filed on Jul. 24, 2019 in the Korean Intellectual Property Office, the contents of which are incorporated by reference herein in its entirety.

BACKGROUND

1. Field

The disclosure relates to a substrate treating apparatus and a substrate treating system having the same, and more particularly, to a substrate treating apparatus having a dielectric window for generating a plasma in a process chamber and a substrate treating system having the same.

2. Description of the Related Art

Various substrate treating processes have been conducted for manufacturing semiconductor devices and semiconductor-applied apparatuses. For example, substrate treating processes have been conducted in a process space that is isolated from surroundings by a dielectric window, and in which an induced energy is generated.

For example, an induced coupled plasma (ICP) process has been performed on a semiconductor substrate as a unit process for manufacturing semiconductor devices. The process space for the ICP process may be isolated from surroundings by the dielectric window, and an antenna may be arranged on the dielectric window. A high frequency power may be applied to the antenna and an electric field may be generated in the process space by an inductive coupling effect. Thus, the ICP process may be performed on the semiconductor substrate in the process space.

Recently, the ICP process has required higher density plasma for increasing the process efficiency. However, higher plasma density may cause more process defects in the ICP process, because the dielectric window tends to be etched away as the plasma density increases.

When the plasma density increases in the process space, higher energy ions and charged particles of the high density plasma continuously collide with the dielectric window along a profile of the antenna by a self-bias effect.

Although the lower surface of the body is covered with the protection layer, the continuous collision of the plasma occurs more intensively at a bias area of the protection layer along the profile of the upper electrode and may cause serious damage to the protection layer along the profile of the upper electrode.

Finally, the lower surface of the body of the dielectric window may be exposed through the damaged protection layer along the profile of the upper electrode. Thus, the lower surface of the body of the dielectric window may be gradually etched away by the plasma, and then, the etched particles of the body may cause various process defects in the plasma process.

SUMMARY

Example embodiments provide a plasma treating apparatus having a dielectric window in which a high etching area of a protection layer is bulged and an etch resistor is provided to minimize plasma damage to the dielectric window.

Other example embodiments provide a plasma treating system having the above plasma treating apparatus.

According to an embodiment, a substrate treating apparatus includes a process chamber having a bottom portion configured to secure a substrate while a substrate treating process is performed on the substrate; and a dielectric window arranged at an upper portion of the process chamber to define a process space, and including: an insulative body, an antenna disposed on an upper surface of the insulative body, a protection layer disposed on a lower surface of the insulative body, and an etch resistor protruding from at least a portion of the protection layer toward the process space, wherein, based on power being applied to the antenna, a plasma is generated in the process space, and wherein the insulative body is protected from the plasma by the protection layer and the etch resistor.

According to an embodiment, a substrate treating apparatus includes a process chamber configured to perform a substrate treating process on a substrate, and having a substrate holder in which a lower electrode is arranged and onto which the substrate is secured; a dielectric window arranged at an upper portion of the process chamber to define a process space, and including: an insulative body, an upper electrode disposed on an upper surface of the insulative body, a protection layer disposed on a lower surface of the insulative body, and an etch resistor protruding from at least a portion of the protection layer toward the process space, wherein the insulative body is protected from a plasma by the protection layer and the etch resistor; a gas supplier configured to supply source gases into the process space through the process chamber and the dielectric window; and a power supply configured to apply a high frequency power to the lower electrode and the upper electrode such that the source gases are changed into the plasma, and the plasma is guided towards the substrate in the process space.

According to an embodiment, a substrate treating system includes a load port configured to receive a transfer pod holding a plurality of substrates; a transfer module configured to select a substrate from among the plurality of substrates held in the transfer pod and transfer the selected substrate for a substrate treating process; and a treating module connected to the transfer module and including a substrate treating apparatus in which the substrate treating process is performed on the selected substrate transferred from the transfer module, wherein the substrate treating apparatus includes: a process chamber configured to perform the substrate treating process on the selected substrate, and having a substrate holder in which a lower electrode is arranged and onto which the selected substrate is secured; a dielectric window arranged at an upper portion of the process chamber to define a process space, and including an insulative body, an upper electrode disposed on an upper surface of the insulative body, a protection layer disposed on a lower surface of the insulative body, and an etch resistor protruding from at least a portion of the protection layer toward the process space, wherein the insulative body is protected from a plasma by the protection layer and the etch resistor; a gas supplier configured to supply source gases into the process space through the process chamber and the dielectric window; and a power supply configured to apply a high frequency power to the lower electrode and the upper electrode such that the source gases are changed into the plasma and the plasma is guided towards the substrate in the process space.

BRIEF DESCRIPTION OF THE DRAWINGS

These and other features of the present disclosure will become more apparent by describing in detail exemplary embodiments thereof with reference to the accompanying drawings, of which.

DETAILED DESCRIPTION OF THE EMBODIMENTS

Figure 1:
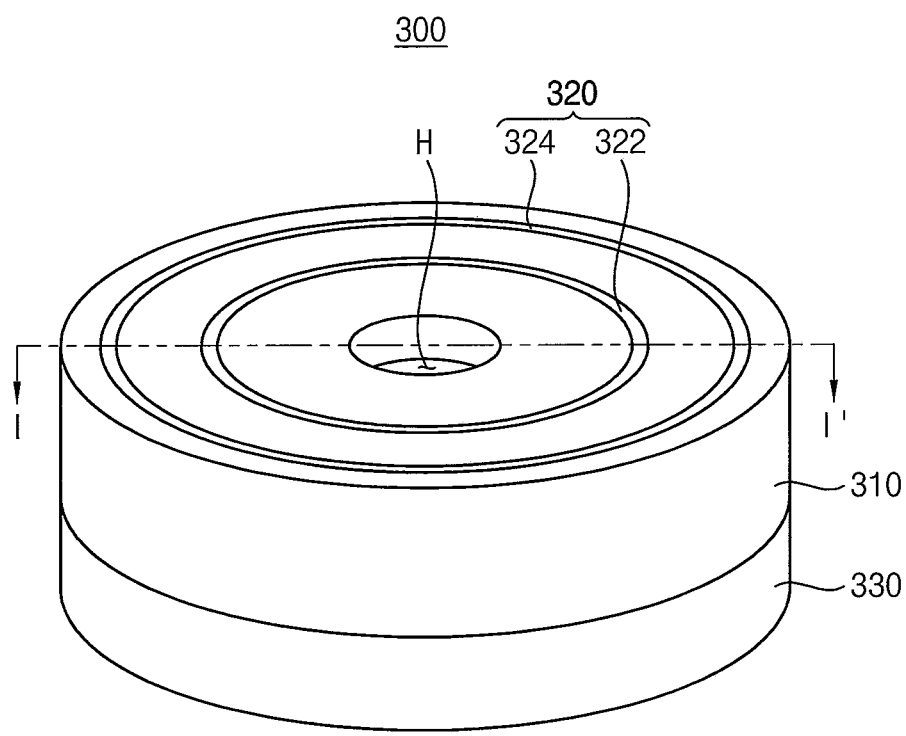
FIG. 1 is a perspective view illustrating a dielectric window for a substrate treating apparatus in accordance with an example embodiment.

Reference will now be made to example embodiments, which are illustrated in the accompanying drawings, wherein like reference numerals may refer to like components throughout.

Figure 2A:
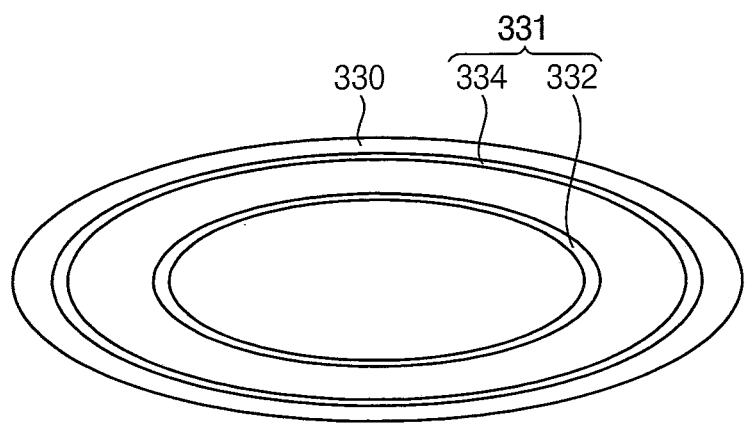
FIG. 2A is a rear view of the dielectric window shown in FIG. 1 in accordance with an example embodiment.

FIG. 1 is a perspective view illustrating a dielectric window for a substrate treating apparatus in accordance with an example embodiment. FIG. 2A is a rear view of the dielectric window shown in FIG. 1 and FIG. 2B is a cross-sectional view of the dielectric window cut along a line I-I' of FIG. 1.

Figure 2B:
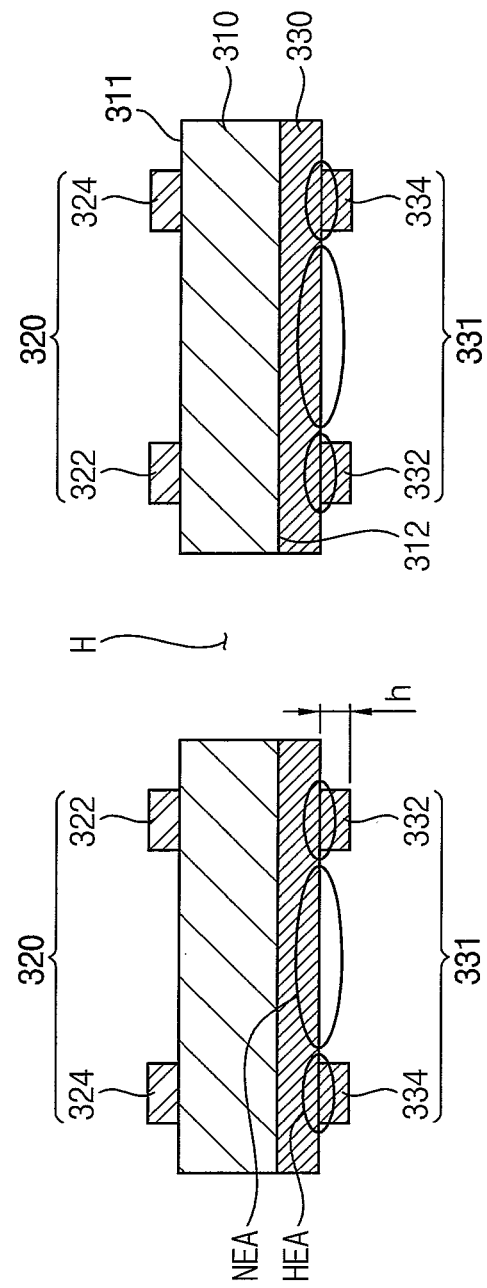
FIG. 2B is a cross-sectional view of the dielectric window cut along a line I-I' of FIG. 1 in accordance with an example embodiment.

Referring to FIGS. 1, 2A and 2B, a dielectric window 300 in accordance with an example embodiment may include an insulative body 310, an antenna 320 on an upper surface 311 of the body 310, and to which a high frequency power may be applied to generate a plasma in a process space, and a protection layer 330 on a lower surface 312 of the body 310 in such a configuration that the protection layer 330 may be partially protruded towards the process space to thereby provide at least an etch resistor 331 on the protection layer 330 and the body 310 may be protected from the plasma by the protection layer 330 and the etch resistor 331.

For example, the body 310 may be arranged at an upper portion of a process chamber in which a substrate treating process may be conducted. An inner space of the process chamber may be provided as the process space and the process space may be isolated from surroundings by the body 310.

Thus, the body 310 may have various shape and structures according to configurations of the process chamber. In the present example embodiment, the process chamber may be shaped into a cylinder and the body 310 may be shaped into a circular disk blocking an upper portion of the cylinder. The circular disk may be shaped into a convex dome that may be curved upwards. Further, the body 310 may also be shaped into an elliptical disk or a polygonal disk according to the shape of the cylinder.

At least a penetration hole H may be provided with the body 310 and source gases for the substrate treating process may be supplied into the process chamber through the penetration hole H. For example, the penetration hole H may be arranged on the body 310 and the sources gases may be supplied into the process chamber from a top portion of the body 310. In another example embodiment, the penetration hole H may be arranged at a side of the body 310 and the source gases may be supplied into the process chamber from a side portion of the body 310.

The body 310 may include insulation materials having a sufficiently low dielectric constant. For example, the body 310 may include alumina ($Al_2O_3$), quartz, silicon carbide (SiC), silicon oxide ($SiO_2$), resin, etc. The resin may include Teflon and epoxy. These may be used alone or in combinations thereof. In contrast, the body 310 may include non-conductive materials or semiconductor materials. In the present example embodiment, the body 310 may include alumina or quartz and have a thickness of about 20 mm to about 30 mm.

For example, the antenna 320 may be arranged on the upper surface 311 of the insulative body 310, and thus the antenna 320 may be electrically insulated from a process space in the process chamber. Thus, when a high frequency power may be applied to the antenna 320, for example using an electromagnetic field, the source gases may be formed into inductively coupled plasma (ICP).

Particularly, the antenna 320 may include an inner coil 322 that may be arranged on a central portion of the body 310 and an outer coil 324 that may be arranged on a peripheral portion of the body 310 and spaced apart from the inner coil 322 in a radial direction. Particularly, the inner coil 322 and the outer coil 324 may have a common center at a center point of the body 310 and may be configured into a spiral structure. The inner coil 322 and the outer coil 324 may be electrically insulated from each other on the body 310.

When the high frequency power may be applied to the antenna 320, an electric field or electromagnetic field may be induced in the process space under the body 310 and the source gases may be changed into plasma state by the electric field. Thus, the inductively coupled plasma may be generated in the process space.

For example, the protection layer 330 may be arranged on a whole lower surface 312 of the body 310 and may protect the body 310 from the plasma in the process space in which the substrate treating process may be conducted to a substrate.

For example, when the body 310 may include alumina or quartz, the body 310 may be damaged by the plasma and the alumina particles or the quartz particles may be generated from the body 310. The alumina or quartz particles may be provided into the substrate and cause defects in the substrate. Thus, the body 310 may function as a contamination source in the substrate treating process.

In such a case, because the lower surface 312 of the body 310 may be covered with the protection layer 330, the body 310 may be protected from the plasma in the process space. Thus, the protection layer 330 may include an etch-resistive material with respect to the plasma.

For example, the protection layer 330 may include metal oxide such as yttrium oxide ($Y_2O_3$), zirconium oxide ($ZrO_2$), manganese oxide ($MnO_2$) and yttrium aluminum garnet ($Y_3Al_5O_2$). The protection layer 330 may have a thickness that may be variable according to the plasma characteristics and an exchange cycle of the dielectric window 300.

When the ICP process may be conducted to the substrate, the protection layer 330 may have the thickness of about 10 μm to about 20 μm. When the thickness of the protection layer 330 may be smaller than 10 μm, the body 310 may not be sufficiently protected from the plasma in the process space, and thus the etched particles from the body 310 may be still provided into the substrate to thereby cause the process defects in the ICP process. In contrast, when the thickness of the protection layer 330 may be greater than 20 μm, the protection layer 330 may be so thick that the ICP is not sufficiently generated in the process space. Therefore, the protection layer 330 may have the thickness of about 10 μm to about 20 μm.

Particularly, the protection layer 330 may be partially bulged toward the process space and have at least a protruding portion of which the thickness may be greater than some or all other portions of the protection layer 330. That is, the protection layer 330 may have greater thickness at the protruding portion, and thus the body 310 corresponding to the protruding portion may be more protected from the plasma etching in the process space. For that reason, the protruding portion of the protection layer 330 may be referred to as an etch resistor 331.

When the source gases may be changed into the plasma by the induced electric field, a self-bias may occur on the lower surface 312 of the body 310 along the profile of the antenna 320. Thus, the high energy ions and particles of the plasma may be focused to a bias area of the protection layer 330 along the profile of the antenna 320 more than any other areas of the protection layer 330.

The bias area of the protection layer 330 may be etched away more rapidly than other areas of the protection layer 330, so that the protection layer 330 may be divided into a high etching area HEA corresponding to the bias area and a normal etching area NEA corresponding to the area of the rest of the protection layer 330 excluding for the high etching area HEA. The high etching area HEA may be arranged along the profile of the antenna 320 on the body 310.

When the substrate treating process is conducted by using the conventional dielectric window, the high etching area HEA of the protection layer 330 is etched away and thus the body 310 is exposed to the process space through the etched protection layer 330 at the high etching area HEA, while the normal etching area NEA of the protection layer 330 still protects the body 310 from the plasma. Thus, the body 310 exposed at the high etching area HEA of the protection layer 330 functions as particle sources in the substrate treating process.

However, according to the present example embodiment of the dielectric window 300, the high etching area HEA of the protection layer 330 may be bulged toward the process space and protruded from the normal etching area NEA at a protrusion height h, to thereby provide the etch resistor 331 having the protrusion height h. That is, the etch resistor 331 may be arranged on the high etching area HEA of the protection layer 330 with the protrusion height h.

Since the high etching area HEA of the protection layer 330 may be protected from the plasmas by the etch resistor 331, the body 310 covered with the high etching area HEA of the protection layer 330 may be further protected from the plasma by the etch resistor 331. Therefore, the body 310 may be sufficiently protected from the plasma in the substrate treating process despite the self-bias on the lower surface 312 of the body 310.

For example, the etch resistor 331 may include a material having high etch resistance to the plasma in the substrate treating process. In the present example embodiment, the etch resistor 331 may include the same material as the protection layer 330, and thus the etch resistor 331 may include metal oxide such as yttrium oxide ($Y_2O_3$), zirconium oxide ($ZrO_2$), manganese oxide ($MnO_2$) and yttrium aluminum garnet ($Y_3Al_5O_2$). However, the etch resistor 331 may include any other materials which may have a sufficient etch resist to the plasma in the process space.

Particularly, when the antenna 320 may be configured into a coil structure, the self-bias may occur on the lower surface 312 of the body 310 along an arrangement profile of the antenna 320, so that the high energy ions and particles may be focused along the arrangement profile of the antenna 320.

Thus, the high energy ions and particles of the plasma may be distributed on the protection layer 330 and relatively more of the high energy ions and particles may be focused onto high etching area HEA of the protection layer 330 along the profile of the antenna 320. That is, the etch resistor 331 may be arranged on the profile of the antenna 320.

In the present example embodiment, the etch resistor 331 and the high etching area HEA of the protection layer 330 may be arranged along the profile of the antenna. In some embodiments, the etch resistor 331 may also deviate from the profile of the antenna 320. When the self-bias may be different from the profile of the antenna 320 according to the plasma characteristics and the method of applying the high frequency power to the process chamber or the body 310, the high etching area HEA of the protection layer 330 may be arranged along the self-bias profile that may deviate from the profile of the antenna 320, and as a result, the etch resistor 331 may be arranged along the high etching area HEA of the protection layer 330 with being deviated from the profile of the antenna 320.

The protrusion height h may be determined by an etch rate difference between the high etching area HEA and the normal etching area NEA of the protection layer 330. That is, The protrusion height h of the etch resistor 331 may be controlled in such a way that a residual of the protection layer 330 may have a uniform thickness along the high etching area HEA and the normal etching area NEA at the time when the dielectric window 300 may be exchanged. Accordingly, the protrusion height h may be determined by the etch rate difference between the high etching area HEA and the normal etching area NEA of the protection layer 330 for preventing the body 310 from being exposed in the substrate treating process.

When the ICP may be generated in the process space of the process chamber, the etch rate of the high etching area HEA may be greater than that of the normal etching area NEA as much as about 30% to about 50% of the etch rate of the normal etching area NEA due to the self-bias at the high etching area HEA.

In such a case, the protrusion height h may be set in a range of about 30% to about 50% of the thickness of the normal etching area NEA of the protection layer 330. In the present example embodiment, the protrusion height h may be in a range of about 5 μm to about 10 μm, and thus the etch resistor 331 may have a thickness of about 5 μm to about 10 μm.

For example, the antenna 320 may include the inner coil 322 on the central portion of the body 310 and the outer coil 324 on the peripheral portion of the body 310 and spaced apart from the inner coil 322 in a radial direction. Thus, the etch resistor 331 may include an inner resistor 332 arranged on the protection layer 330 along the inner coil 322 and an outer resistor 334 arranged on the protection layer 330 along the outer coil 324. The outer resistor 334 may be spaced apart from the inner resistor 332 in the radial direction of the body 310 in a similar way that the inner coil 322 and the outer coil 324 may be spaced apart from each other in the radial direction.

Because the etch resistor 331 may be arranged along the high etching area HEA of the protection layer 330, the distribution of the etch resistor 331 may also be varied according to the configurations of the antenna 320. Thus, when the antenna 320 may be configured to a single coil structure or a triple coil structure, the etch resistor 331 may also be structured into a single etch resistor 331 or into a triple etch resistors according to the coil structure of the antenna 320.

The shape of the etch resistor 331 may be varied according to the characteristics of the self-bias.

Figure 3A:
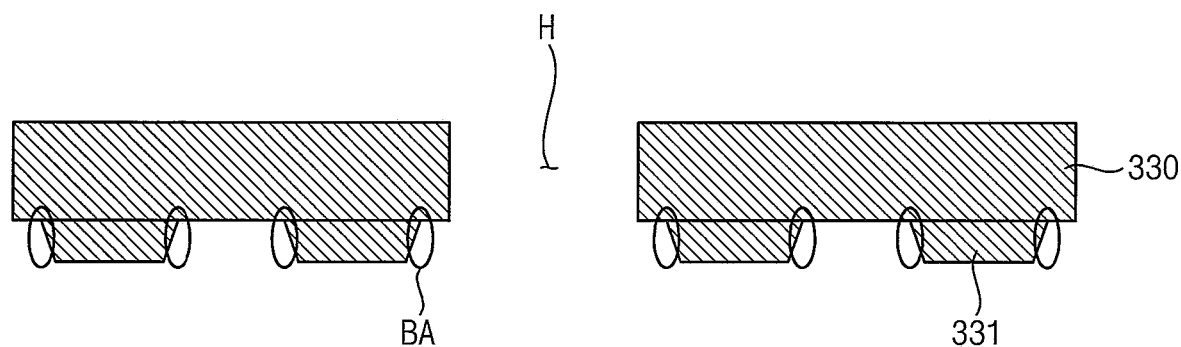
FIGS. 3A and 3B are cross-sectional views illustrating modifications of the etch resistor shown in FIGS. 2A and 2B in accordance with example embodiments.
Figure 3B:
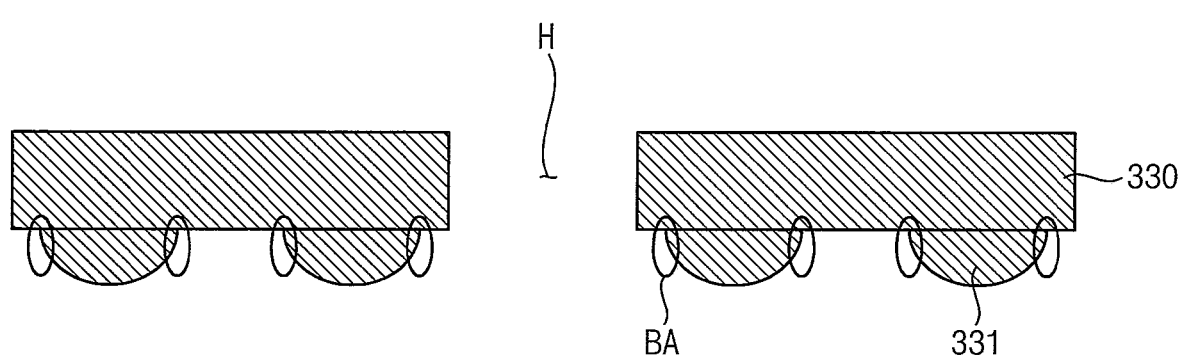

FIGS. 3A and 3B are cross-sectional views illustrating embodiments relating to modifications of the etch resistor shown in FIGS. 2A and 2B.

Referring to FIGS. 3A and 3B, the etch resistor 331 may be modified into a trapezoidal shape and a curved shape according to the behaviors of the high energy ions and particles.

When the high energy ions and particles of the plasma may be focused onto the high etching area HEA of the protection layer 330 due to the self-bias, the density of the high energy ions and particles may be relatively high at a boundary area BA between the etch resistor 331 and the protection layer 330. Thus, the sidewall of the etch resistor 331 and the boundary area of the etch resistor 331 connected to the protection layer 330 may be more rapidly etched away than an upper portion of the etch resistor 331.

Therefore, the sidewall of the etch resistor 331 may be modified so as to prevent an over-etch to the boundary area BA between the etch resistor 331 and the protection layer 330 and to the sidewall of the etch resistor 331. For example, the sidewall of the etch resistor 331 may be modified to a slant wall that may be inclined outward with respect to a surface of the protection layer 330 at a constant slant angle, as illustrated in FIG. 3A. In contrast, the sidewall of the etch resistor 331 may be modified to a curved wall that may be inclined outward with respect to a surface of the protection layer 330 at a variable slant angle, as illustrated in FIG. 3B. The curved wall may be shaped into a concaved semicircle of which the slant angle of the tangent line may increase from a central portion to a peripheral portion of the curved wall.

Therefore, the high energy ions and particles of the plasma may be uniformly distributed along the sidewall and top surface of the etch resistor 331 and the etch resistor 331 may be uniformly etched away along a whole surface of the etch resistor 331.

The slant angle of the sidewall of the etch resistor 331 may be varied according to the behaviors of the high energy ions and particles and the distribution characteristics of the plasma in the process space. Thus, the shape of the etch resistor 331 may be varied according to the behaviors of the high energy ions and particles and the distribution characteristics of the plasma in the process space. For example, the etch resistor 331 may also be configured into an elliptical shape and a parabolic shape.

According to the dielectric window 300 for a substrate treating apparatus, the etch resistor 331 may be arranged on the protection layer 330 along the high etching area HEA that may be arranged on the bias area at which the self-bias may occur. For example, the high etching area HEA of the protection layer 330 may be arranged along the arrangement profile of the antenna 320 and the etch resistor 331 may be protruded from the protection layer 330 at the protrusion height h. The etch resistor 331 may have a sufficient etch resistance to the high energy ions and particles, and thus the body 310 maybe sufficiently prevented from being exposed in the substrate treating process. Accordingly, the contamination particles etched from the body 310 may be sufficiently prevented and the process defects caused by the contamination particles may be sufficiently reduced in the substrate treating process.

Figure 4:
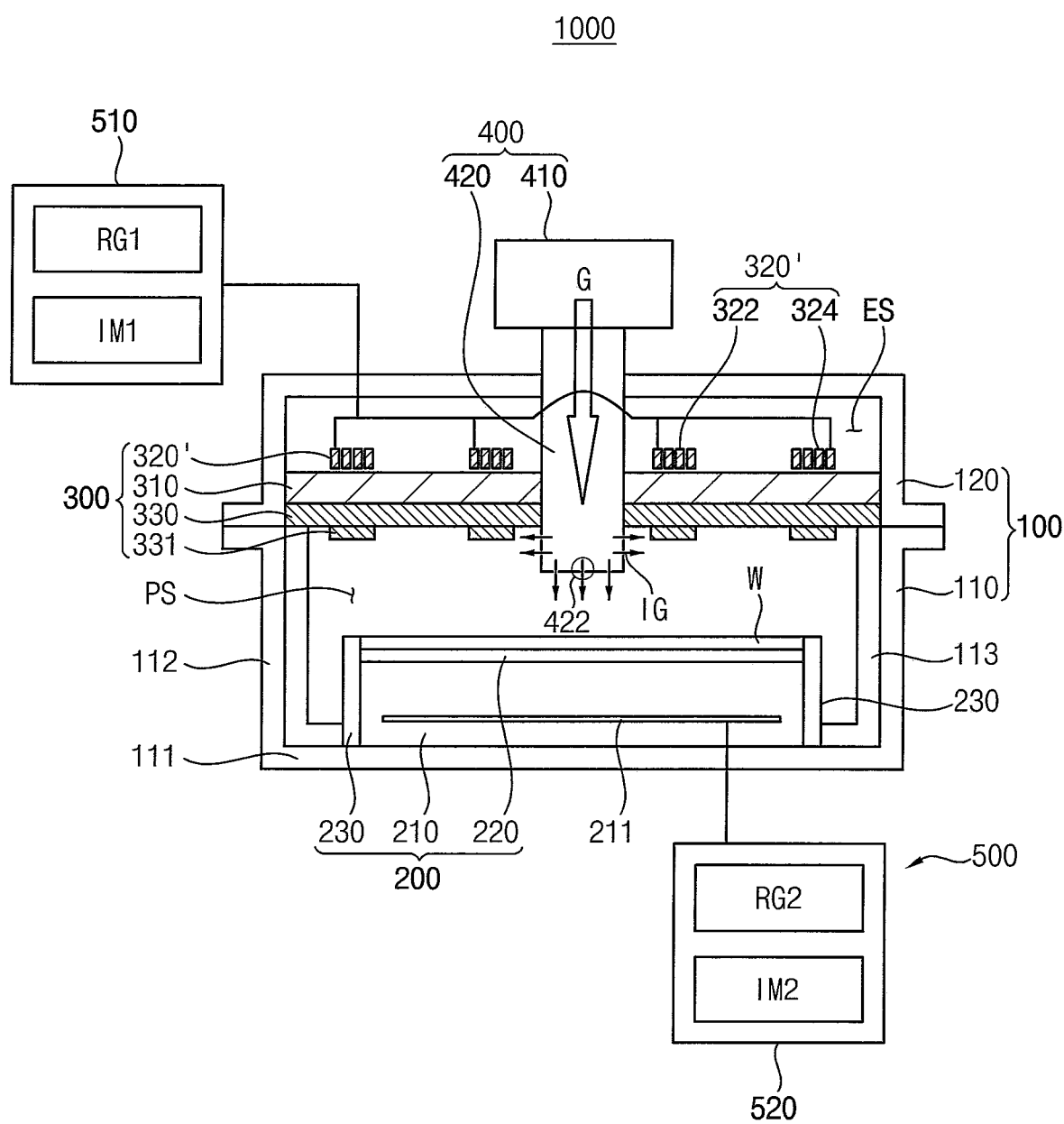
FIG. 4 is a structural view illustrating a substrate treating apparatus including the dielectric window shown in FIG. 1 in accordance with an example embodiment.

FIG. 4 is a structural view illustrating a substrate treating apparatus including the dielectric window shown in FIG. 1 in accordance with an example embodiment. In the present example embodiment, a plasma treating apparatus in which a plasma process may be conducted to a substrate may be provided as the substrate treating apparatus. However, the substrate treating apparatus may include any other apparatuses as long as a substrate may be treated by using the dielectric window as shown in FIG. 1.

Referring to FIG. 4, a substrate treating apparatus 1000 in accordance with an example embodiment may include a process chamber 100, a substrate holder 200 onto which a substrate W may be secured, a dielectric window 300 arranged at an upper portion of the process chamber 100, a gas supplier 400 and a power supply 500.

For example, the process chamber 100 may include a lower housing 110 and an upper housing 120. The lower housing 110 may be shaped into an open box of which an upper portion may be opened and the substrate holder 200 may be arranged at a bottom. The upper housing 120 may also be shaped into an open box of which a lower portion may be opened and the dielectric window 300 and the gas supplier 400 may be provided with the upper housing 120. The upper housing 120 may be detachably combined with the lower housing 110 in such a configuration that an inner space of the lower housing 110 may be isolated from surroundings.

Particularly, the inner space of the lower housing 110 may be sealed from surroundings by the dielectric window 300 and may be provided as a process space PS for conducting the plasma process to the substrate W. The dielectric window 300 may be detachably combined with the upper portion of the lower housing 110 and then may be detachably secured to the upper housing 120 in the process chamber 100. Thus, the dielectric window 300 may be detachably combined with the upper housing 120 and then the upper housing 120 holding the dielectric window 300 may be detachably combined with the lower housing 110 in such a way that the dielectric window 300 may be secured to the lower housing 110. Therefore, the dielectric window 300 may be detachably combined with both of the lower housing 110 and the upper housing 120.

The lower housing 110 and the upper housing 120 may have a sufficient strength and rigidity for the plasma process in the process space PS, so that the plasma process to the substrate W may be conducted in the process chamber 100 with high reliability and stability. For example, the plasma process may include a plasma etching process, a plasma deposition process and a plasma cleaning process. However, any other plasma processes could also be conducted in the process chamber 100 as long as the process space PS may be sealed from surroundings by the dielectric window 300.

The lower housing 110 may include a bottom 111 and a sidewall 112 extending upwards from the bottom 111. For example, the bottom 111 may be shaped into a circular plate and the sidewall 112 may extend from a circular peripheral portion of the circular plate, so that the lower housing 110 may be configured into a cylinder of which the upper portion may be opened.

For example, the substrate holder 200 may be arranged at a central portion of the circular bottom 111 and the substrate W may be secured onto the substrate holder 200. The substrate holder 200 may be enclosed by a focus ring structure 230 and the bottom 111 around the substrate holder 200 and the sidewall 112 may be covered with a wall liner 113. The wall liner 113 may include an insulation material such as ceramics and quartz, so the bottom 111 and the sidewall 112 may be protected from the plasma and may prevent arching in the process space PS.

Particularly, the wall liner 113 may extend to the upper portion of the lower housing 110 in such a configuration that the dielectric window 300 may be supported by the wall liner 113. However, the dielectric window 300 may be supported by any other supporting structures including the wall liner 113 and the sidewall 112.

Although not shown in figures, a gate structure may be provided at a side of the lower housing 110. The substrate W may be loaded onto the substrate holder 200 or may be unloaded from the process chamber 100 through the gate structure. When the substrate W may be loaded onto the substrate holder 200, the gate structure may be closed and the process space PS may be sealed from surroundings. When the plasma process to the substrate W may be completed, the substrate W may be unloaded from the gate structure by using a pressure controller of the gate structure.

For example, the substrate holder 200 may include a body 210 secured to the bottom 111 of the lower housing 110, a holding member 220 combined at an upper surface of the body 210 and to which the substrate W may be secured and the focus ring structure 230 enclosing the body 210 and the holding member 220. The focus ring structure 230 may include an insulation ring therein.

The body 210 may include a conductive material such as aluminum (Al) and may have a sufficient size and configurations for accommodating the holding member 220. A lower electrode 211 may be provided in the body 210 and a second electric power 520 may applied to the lower electrode 211 for applying a bias power to the plasma in the process space PS. The plasma in the process space PS may be forced to flow toward the substrate W by the bias power. For example, the second electric power 520 may include a radio frequency (RF) power.

The holding member 220 may be arranged on the upper surface of the body 210 and may be shaped into a disk including insulation materials. A securing member may be provided with the holding member 220, and thus the substrate W may be secured to the holding member 220 by the securing member.

In the present example embodiment, the holding member 220 may include an electro static chuck (ESC) having a pair of polyimide films and a conductive layer interposed between the pair of polyimide films. When a direct current (DC) may be applied to the conductive layer of the ESC, electric charges may be generated on the pair of polyimide films and the substrate W may be secured to the ESC by the electrostatic force of the electric charges.

While the present example embodiment discloses the ESC as the holding member 220, any other members may also be utilized as the holding member 220 as long as the substrate W may be sufficiently secured to the member. For example, a mechanical holder such as a clamp may also be utilized for the holding member 220.

For example, the dielectric window 300 may include a dielectric material having a relatively low dielectric constant and may generate an electrical field for generating the plasma in the process space PS. The dielectric window 300 may be shaped into a disk for blocking the upper portion of the cylinder-shaped lower housing 110.

The dielectric window 300 may have substantially the same structures as the dielectric window 300 described in detail with reference to FIGS. 1 to 3B. Thus, in FIG. 4, the same reference numerals denote the same elements in FIG. 1 to 3B.

The dielectric window 300 may include the insulative body 310 combined with the upper portion of the lower housing 110 and isolating the process space PS from surroundings, an upper electrode 320' arranged on an upper surface 311 of the body 310 and to which a high frequency power may be applied and the protection layer 330 covering a lower surface 312 of the body 310 in the process space PS and partially protruded along a profile of the upper electrode 320' as the etch resistor 331.

The body 310 may include an insulation material such as alumina ($Al_2O_3$), quartz, silicon carbide (SiC), silicon oxide ($SiO_2$) and a resin and the protection layer 330 may include a metal oxide such as yttrium oxide ($Y_2O_3$), zirconium oxide ($ZrO_2$), manganese oxide ($MnO_2$) and yttrium aluminum garnet ($Y_3Al_5O_2$). These may be used alone or in any desired combination. The protection layer 330 may protect the body 310 from the plasma when the plasma process may be conducted to the substrate W in the process space PS.

In the present example embodiment, the body 310 and the protection layer 330 may be shaped into a disk blocking the process chamber 100. The penetration hole H may be provided with the central portion of the body 310 and the source gases for the plasma may be provided into the process space through the penetration hole H.

The upper electrode 320' may be arranged on the upper surface 311 of the body 310 in an electrode space ES defined by the upper housing 120 and the body 310. A first electric power 510 may be connected to the upper electrode 320' through the upper housing 120 and a high frequency power may be applied to the upper electrode 320' from the first electric power 510. The upper electrode 320' may have substantially the same structures as the antenna 320 of the dielectric window 300 shown in FIG. 1.

For example, the upper electrode 320' may include the inner coil 322 that may be arranged on the central portion of the body 310 and the outer coil 324 that may be arranged on the peripheral portion of the body 310 and spaced apart from the inner coil 322 in the radial direction.

Particularly, the inner coil 322 and the outer coil 324 may have a common center at a center point of the body 310 and may be configured into a spiral structure. The inner coil 322 and the outer coil 324 may be electrically insulated from each other on the body 310. The inner coil 322 may be provided as the spiral structure enclosing the penetration hole H and the outer coil 324 may be provided as the spiral structure enclosing the inner coil 322.

Although not shown in figures, an insulation structure may be further arranged on the upper surface 311 of the body 310 for electrically insulating the inner coil 322 and the outer coil 324. The inner coil 322 and the outer coil 324 may be spaced apart from each other in the radial direction and the insulation structure may be arranged on the body 310 between the inner coil 322 and the outer coil 324.

When the high frequency power may be applied to the upper electrode 320', the self-bias may occur on the lower surface 312 of the body 310 along the profile of the upper electrode 320'.

Thus, the high energy ions and particles of the plasma may be focused to the high etching area HEA of the protection layer 330 along the profile of the upper electrode 320' more than the normal etching area NEA of the protection layer 330. Accordingly, the conventional protection layer is more etched away at the high etching area HEA than at the normal etching area NEA, so that the body of the conventional dielectric window is partially exposed at the high etching area HEA of the protection layer 330 and may provide particle sources in the plasma process.

However, the high etching area HEA of the protection layer 330 in the present example embodiment may be bulged toward the process space PS and be protruded from the normal etching area NEA at the protrusion height h, to thereby provide the etch resistor 331 arranged along the profile of the upper electrode 320' with the protrusion height h.

Thus, since the high etching area HEA of the protection layer 330 may be protected from the plasmas by the etch resistor 331, the body 310 covered with the high etching area HEA of the protection layer 330 may be further protected from the plasma by the etch resistor 331. Therefore, the body 310 may be sufficiently protected from the plasma in the plasma process in spite of the self-bias on the lower surface 312 of the body 310.

The dielectric window 300 may have substantially the same structures as the dielectric window 300 as described in detail with references to FIGS. 1 to 3B, and thus any further detailed descriptions on the dielectric window 300 are omitted.

For example, the gas supplier 400 may supply plasma source gases G into the process space PS though the upper housing 120 and the penetration hole H of the dielectric window 300. The source gases may be changed into plasma state by the high frequency power applied to the upper electrode 320'.

The gas supplier 400 may be positioned at an exterior of the substrate treating apparatus 1000 and may include a source tank 410 for containing the plasma source gases G and a supply head 420 extending into the process space PS from the source tank 410. The source gases G may flow from the source tank 410 and may be supplied into the process space PS from the supply head 420.

The supply head 420 may be shaped into a cylinder extending into the process space PS through the upper housing 120 and the penetration hole H of the dielectric window 300. A plurality of injection holes 422 may be provided with the supply head 420 and the source gases G may be injected into the process space PS from the injection holes 422. Thus, the source gases G may be supplied into the process space PS as injection gases IG.

For example, the power supply 500 may include the first electric power 510 for applying the high frequency power to the upper electrode 320' and the second electric power 520 for applying the high frequency power to the lower electrode 211. In the present example embodiment, the high frequency power may include a radio frequency (RF) power. However, any other high frequency powers as well as the RF power may also be applied to the upper and lower electrodes 320' and 211 according to the characteristics of the plasma process.

In the preset example embodiment, the same RF power may be applied to the upper electrode 320' and the lower electrode 211. In some embodiments, an individual high frequency power may be applied to the upper electrode 320' and the lower electrode 211, respectively.

For example, the first electric power 510 may include a first RF generator RG1 for generating the RF power and a first impedance matcher IM1.

The first RF generator RG1 may generate the RF power having a frequency of about 50 MHz to about 70 MHz and the first impedance matcher IM1 may match the impedance of the first RF generator RG1 and the upper electrode 320'. A plurality of the RF generators may be provided as the first RF generator RG1 in such a configuration that the RF generators may generate different RF powers having different frequencies. The first impedance matcher IM1 may be connected to the upper electrode 320' and the first RF generator RG1 via electric circuit structures.

Figure 5:
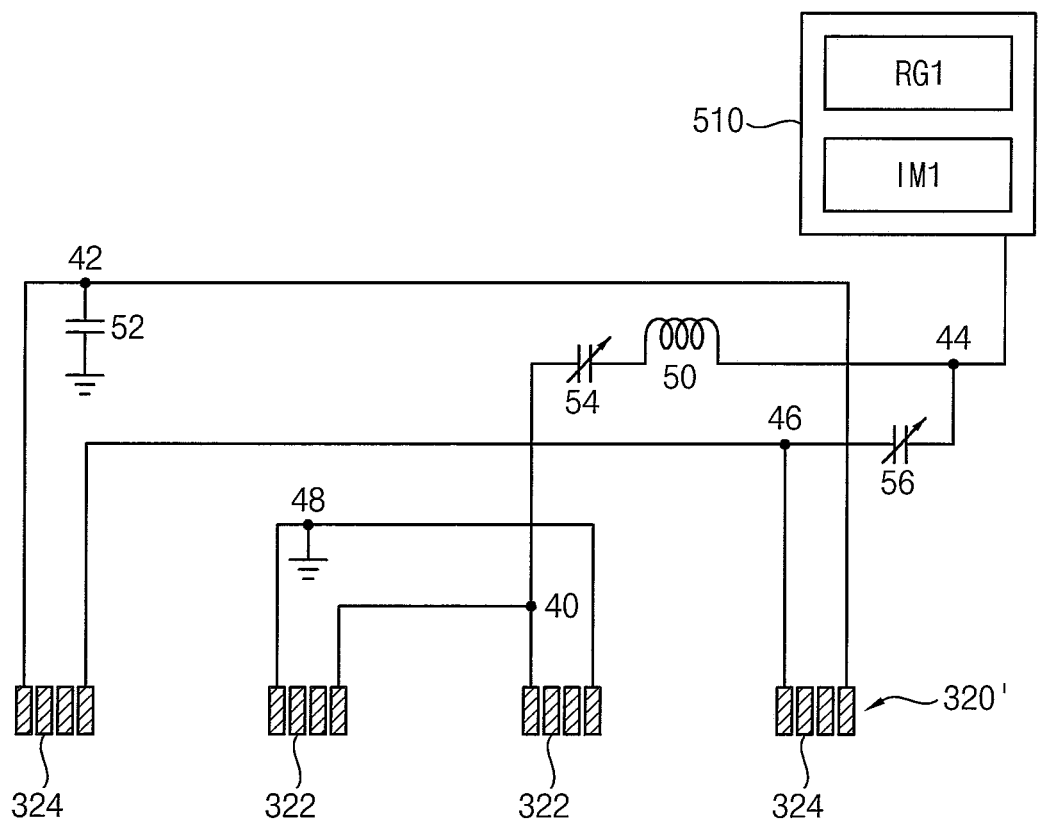
FIG. 5 is a circuit diagram of the electric circuit structure electrically connecting the first electric power and the upper electrode shown in FIG. 4 in accordance with an example embodiment.

FIG. 5 is a circuit diagram of the electric circuit structure electrically connecting the first electric power 510 and the upper electrode 320' shown in FIG. 4.

Referring to FIG. 5, the inner coil 322 and the outer coil 324 of the upper electrode 320' may be connected to the first electric power 510 via the electronic circuits. For example, inner terminals of the outer coil 324 may be connected to a node 46 and may be connected to the first electric power 510 via a variable capacitor 56 and a node 44. In addition, outer terminals of the outer coil 324 may be connected to a node 42 that may be connected to a capacitor 52.

Inner terminals of the inner coil 322 may be connected to a node 40 and may be connected to the first electric power 510 via a variable capacitor 54, an inductor 50 and the node 44. The variable capacitor 54 and the inductor 50 may be positioned between a pair of the nodes 40 and 44. In addition, outer terminals of the inner coil 322 may be connected to a node 48 that may be connected to a ground.

The first electric power 510 may control the electric power of the inner coil 322 and the outer coil 324 by a dynamic tuning of the variable capacitors 54 and 56. A relatively higher power may be applied to one of the inner coil 322 and the outer coil 324 and a relatively lower power may be applied to the rest of the inner coil 322 and the outer coil 324. In contrast, a uniform power may be applied to both of the inner coil 322 and the outer coil 324. In addition, the variable capacitors 54 and 56 may be controlled at first in accordance with the power ratio of the inner coil 322 and the outer coil 324, and then may the power may be applied to the inner coil 322 and the outer coil 324 according to the power ratio.

The foregoing electric circuits are illustrative of example embodiments and is not to be construed as limiting thereof. For example, any other circuits may also be provided with the substrate treating apparatus 1000 in alone or in combinations with the electric circuits shown in FIG. 5 for better tuning and control to the electric power to the upper electrode 320'.

For example, the second electric power 520 may include a second RF generator RG2 for generating the RF power and a second impedance matcher IM2. The second RF generator RG2 may generate the RF power having a frequency of about 2 MHz to about 6 MHz and the second impedance matcher IM2 may match the impedance of the second RF generator RG2 and the lower electrode 211.

The second RF generator RG2 may apply the RF power to the lower electrode 211, so that the bias power may be applied to the plasma in the process space PS in such a way that the plasma may flow toward the substrate W. In the same configurations as the first RF generator RG1, a plurality of the RF generators may be provided as the second RF generator RG2 in such a configuration that the RF generators may generate different RF powers having different frequencies. The second impedance matcher IM2 may also be connected to the lower electrode 211 and the second RF generator RG2 via electric circuit structures.

When the RF power may be applied to the inner coil 322 and the outer coil 324 of the upper electrode 320' from the first RF generator RG1, an electric field may be induced by the RF power and the dielectric window 300 and the injected gases IG may be changed into the plasma in the process space PS due to the energy of the electric field. Thereafter, the plasma process may be conducted to the substrate W secured to the holding member 220. In such a case, the plasma density in the process space PS may be controlled by the high frequency power.

Particularly, the self-bias may occur along the profile of the upper electrode 320' when the RF power may be applied to the upper electrode 320', so the high energy ions and particles of the high density plasma may be focused at the high etching area HEA of the protection layer 330.

In such a case, the etch resistor 331 may be arranged on the protection layer 330 along the high etching area HEA with a thickness corresponding to the protrusion height h. The etch resistor 331 may have a sufficient etch resistance to the high energy ions and particles, and thus the body 310 may be sufficiently prevented from being exposed in the plasma process. Accordingly, the contamination particles etched from the body 310 may be sufficiently prevented and the process defects caused by the contamination particles may be sufficiently reduced in the plasma process.

Figure 6:
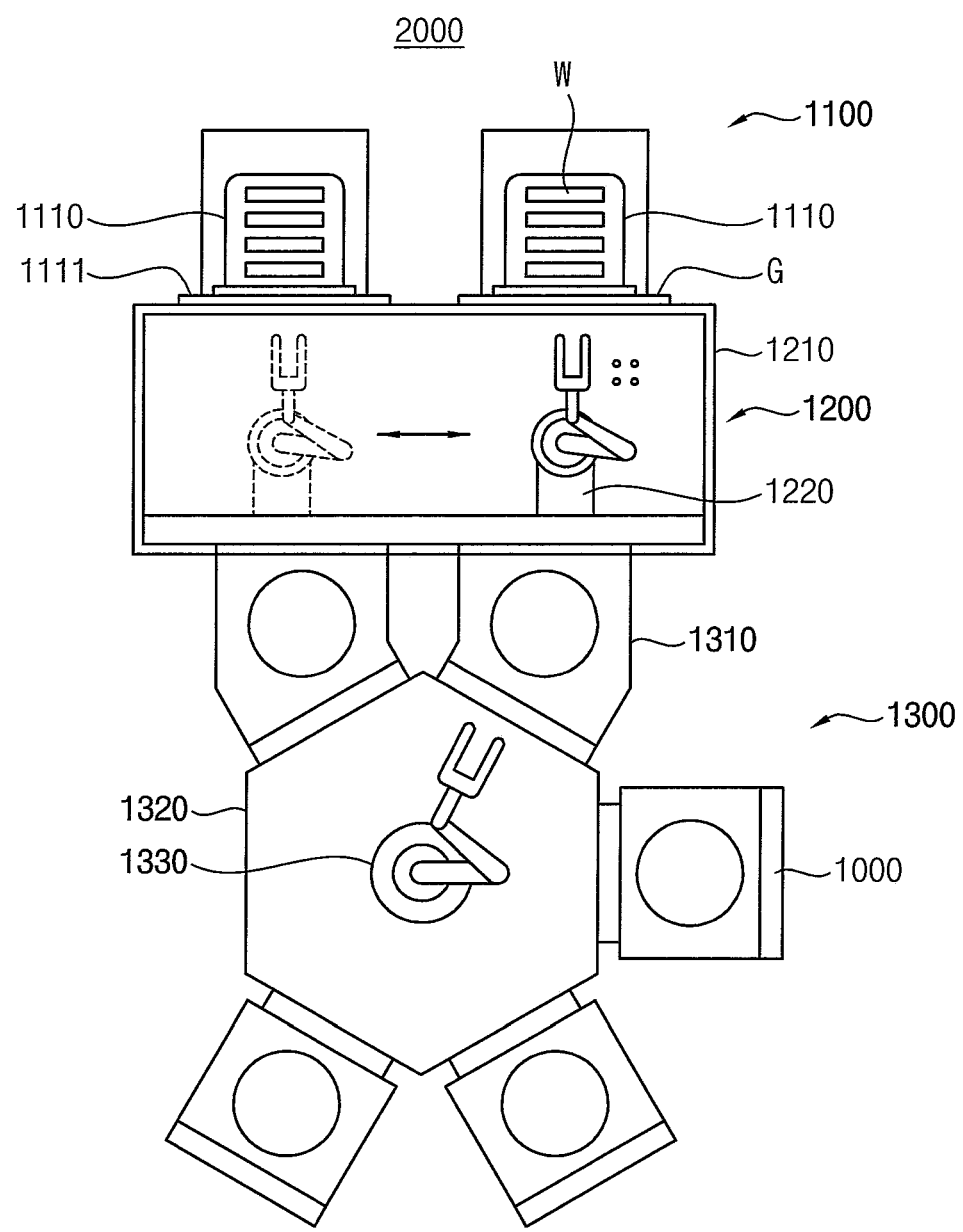
FIG. 6 is a structural view illustrating a substrate treating system including the substrate treating apparatus shown in FIG. 4 in accordance with an example embodiment.

FIG. 6 is a structural view illustrating a substrate treating system including the substrate treating apparatus shown in FIG. 4 in accordance with an example embodiment.

Referring to FIG. 6, a substrate treating system 2000 in accordance with an example embodiment may conduct the substrate treating process to a substrate in the substrate treating apparatus 1000 shown in FIG. 4. Thus, in FIG. 6, the same reference numerals denote the same element in FIG. 4, and any further detailed descriptions on the same element will be omitted hereinafter.

For example, the substrate treating system 2000 may include a load port 1100, a transfer module 1200 and a treating module 1300.

For example, the load port 1100 may receive a transfer pod 1110 such as a wafer cassette and a FOUP holding a plurality of the substrates W. A plurality of the substrates W may be standby at the load port 1100 and be sequentially loaded into the substrate treating apparatus 1000 for the substrate treating process and the treated substrate W may be unloaded from the substrate treating apparatus 1000 and be stacked again into the transfer pod 1110 at the load port 1100.

The transfer pod 1110 may be positioned on the load port 1100 in such a configuration that a door 1111 of the transfer pod 1110 may make contact with a transfer gate G of the transfer module 1200. When the substrate treating process may be initiated, the transfer gate G may be opened at first and the substrate W in the transfer pod 1110 may be individually picked up by the transfer module 1200 and be transferred to the treating module 1300.

For example, the transfer module 1200 may include a transfer chamber 1210 connected to the transfer pod 1110 via the transfer gate G and a transfer unit 1220 positioned in the transfer chamber 1210 and picking up the substrate W from the transfer pod 1110 and transferring the picked substrate to the treating module 1300 or unloading the treated substrate from the treating module 1300 and stacking the treated substrate into the transfer pod 1110.

The transfer chamber 1210 may include a cubic structure having a closed transfer space and the transfer unit 1220 may be secured to a bottom or a sidewall of the transfer chamber 1210. The transfer unit 1220 may select the substrate W with reference to a pod number of the transfer pod 1110 and a slot number in the transfer pod 1110. In the same way, the treated substrate W may be stacked in the designated slot of the transfer pod 1110 with references to the pod number and the slot number.

The picked substrate W may be transferred to the treating module 1300 from the transfer chamber 1210 and the substrate treating process may be conducted to the substrate W in the treating module 1300. For example, the treating module 1300 may include a load lock chamber 1310 exchanging the substrate W with the transfer chamber 1210, a loading chamber 1320 loading the substrate W into the substrate treating apparatus 1000 from the load lock chamber 1310 and at least a substrate treating apparatus 1000 connected to the loading chamber 1320 and conducting the substrate treating process to the substrate W.

The load lock chamber 1310 may be maintained under intermediate conditions between the process conditions in the loading chamber 1320 and the atmospheric conditions in the transfer chamber 1210, the condition shock to the substrate W may be minimized in the substrate treating process. For example, the temperature shock to the substrate W between the room temperature and the high process temperature of the substrate treating process may be sufficiently reduced by the load lock chamber 1310. In addition, the pressure shock to the substrate W between the atmospheric pressure in the transfer chamber 1210 and the vacuum pressure of the substrate treating process may be sufficiently reduced by the load lock chamber 1310.

The loading chamber 1320 may include a substrate loader 1330 for selecting the substrate from the load lock chamber 1310 and loading the substrate W into the substrate treating apparatus 1000 that may be standby for the substrate treating process. Particularly, a plurality of the substrate treating apparatuses 1000 may be arranged around a single loading chamber 1320, so that a plurality of the substrate treating processes may be simultaneously conducted in the substrate treating system 2000.

The substrate treating apparatus 1000 may have substantially the same structures as the substrate treating apparatus 1000 described in detail with reference to FIGS. 4 and 5. In the present example embodiment, the substrate treating apparatus may include a plasma etching apparatus and a plasma deposition apparatus.

In each of the substrate treating apparatuses 1000 in the substrate treating system 2000, the self-bias may occur along the profile of the upper electrode 320' when the RF power may be applied to the upper electrode 320', so the high energy ions and particles of the high density plasma may be focused at the high etching area HEA of the protection layer 330 extending along the profile of the upper electrode 320'. In such a case, the etch resistor 331 may be arranged on the protection layer 330 along the high etching area HEA with a thickness corresponding to the protrusion height h. The etch resistor 331 may have a sufficient etch resistance to the high energy ions and particles, and thus the body 310 may be sufficiently prevented from being exposed in the plasma process. Accordingly, the contamination particles etched from the body 310 may be sufficiently prevented and the process defects caused by the contamination particles may be sufficiently reduced in the plasma process.

FIGS. 7A to 7J are views illustrating processing steps for a method of forming the dielectric window shown in FIGS. 1 to 3B in accordance with an example embodiment. FIGS. 7A, 7C, 7E, 7G, and 7I show a rear view of each processing step, and FIGS. 7B, 7D, 7F, 7H, and 7J show a cross-sectional view of each processing step cut along a line I-I' of FIG. 1.

Figure 7A:
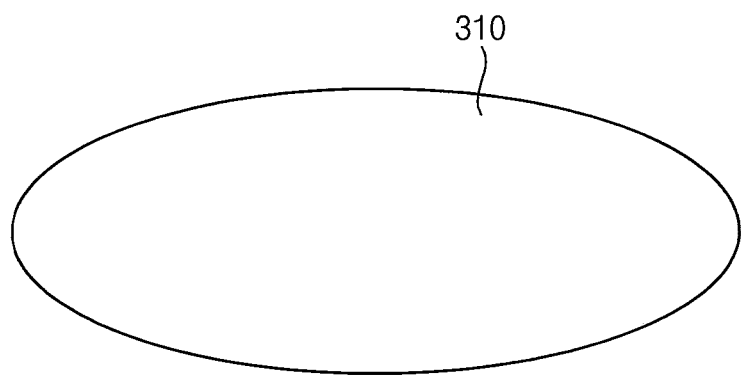
FIGS. 7A to 7J are views illustrating processing steps for a method of forming the dielectric window shown in FIGS. 1 to 3B in accordance with an example embodiment.
Figure 7B:
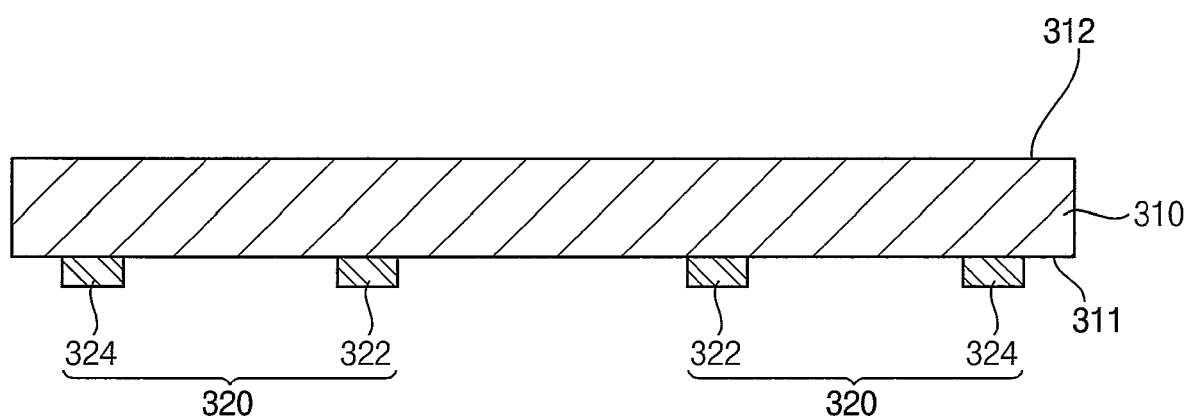

Referring to FIGS. 7A and 7B, the body 310 for the dielectric window 300 may be formed at first and the antenna 320 may be formed on the body 310. The antenna 320 may function as the upper electrode in the substrate treating apparatus 1000.

At first, a sintering process or a molding process may be performed on a ceramic or a resin, to thereby form the body 310 in such a configuration that the upper portion of the lower housing 110 may be covered with the body 310.

For example, the sintering process may be performed on the ceramic such as alumina ($Al_2O_3$) and quartz in such a way that the ceramic is shaped into a disk sufficiently blocking the upper portion of the lower housing 110. In contrast, the molding process may be conducted by using the resins such as Teflon and epoxy in such a way that the resin is shaped into a disk sufficiently blocking the upper portion of the lower housing 110. Otherwise, the body 310 may be formed on a substrate by a deposition process or a coating process. In such a case, the body 310 may include silicon carbide (SiC) or silicon oxide ($SiO_2$).

When the body 310 may be formed of the ceramic, a plurality of voids may be generated in the body 310. Thus, a surface treatment may be further conducted to the ceramic body 310 for removing the inner voids from the body 310.

Then, the antenna 320 maybe formed on the body 310. The high frequency power may be applied to the antenna 320 in the substrate treating apparatus 1000 for the substrate treating process.

For example, the inner coil 322 and the outer coil 324 may be formed into a spiral structure on the body 310 in such a way that the inner coil 322 and the outer coil 324 may have a common center at a center point of the body 310 and may be electrically insulated from each other on the body 310.

The inner coil 322 may be formed into the spiral structure enclosing a central area at which the penetration hole H may be formed in a subsequent process and the outer coil 324 may be formed into the spiral structure enclosing the inner coil 322 at the peripheral portion of the body 310.

Figure 7C:
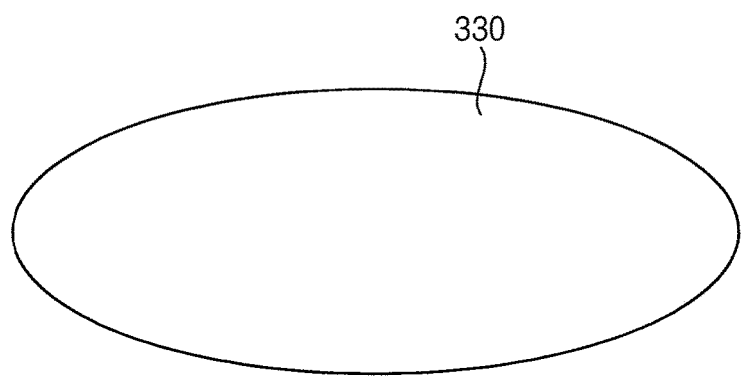
Figure 7D:
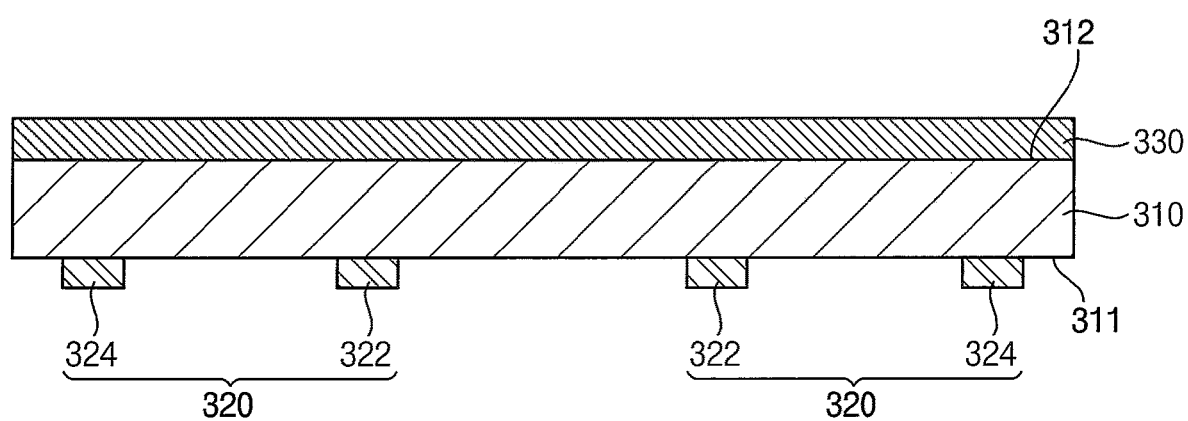

Referring to FIGS. 7C and 7D, the protection layer 330 may be formed on the lower surface 312 of the body 310. For example, a metal oxide layer may be formed on the lower surface 312 of the body 310 to a sufficient thickness by one of a spin coating process, a deposition process and an electroplating process. In an example embodiment, the metal oxide layer may be formed on the lower surface 312 by a printing process such as an aerosol coating process. In such a case, the thickness of the protection layer 330 may be controlled by the number of the printing to the lower surface 312 of the body 310.

For example, examples of the metal oxide may include yttrium oxide ($Y_2O_3$), zirconium oxide ($ZrO_2$), manganese oxide ($MnO_2$), yttrium aluminum garnet ($Y_3Al_5O_2$), etc. These may be used alone or in combinations thereof. The protection layer 330 may be formed to a sufficient thickness in view of the plasma characteristics of the substrate treating process and the exchange cycle of the dielectric window 300. In the present example embodiment, the protection layer 330 may be formed to a thickness of about 5 μm to about 10 μm.

Figure 7E:
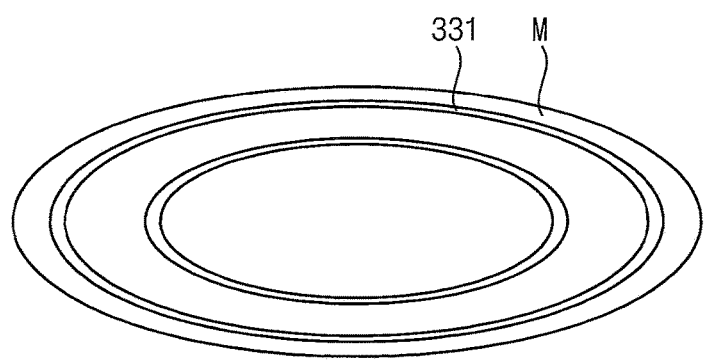
Figure 7F:
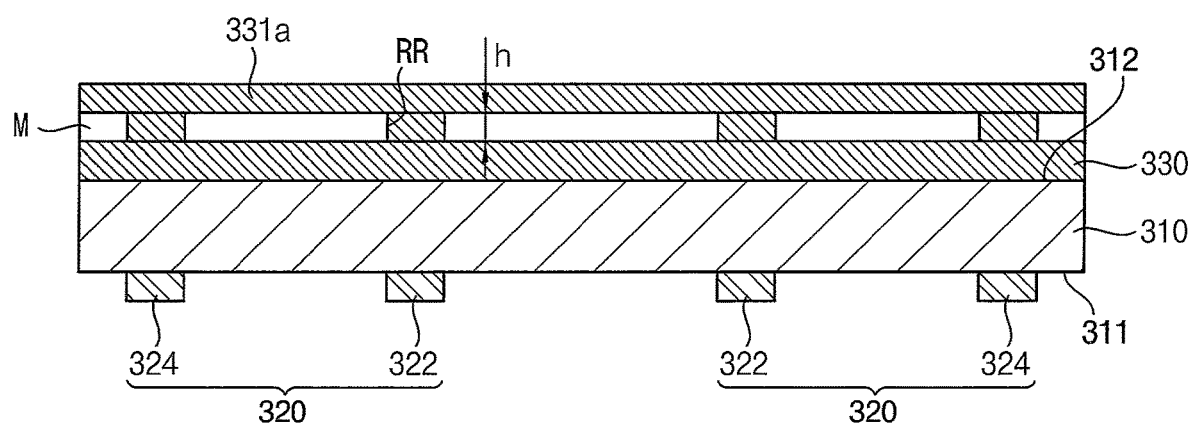

Referring to FIGS. 7E and 7F, a mask pattern M having a recess ring RR may be formed on the protection layer 330 and an etch resistor layer 331 may be formed on the mask pattern M to a sufficient thickness to fill in the recess ring RR.

The protection layer 330 may be partially exposed through the recess ring RR of the mask pattern M and the profile of the recess ring RR may be substantially the same as the profile of the antenna 320 on the upper surface 311 of the body 310. Thus, the high etching area HEA of the protection layer 330 may be exposed through the recess ring RR of the mask pattern M. The information of the high etching area HEA may be obtained from the configurations of the lower housing 110 and the design specifications of the antenna 320, and the recess ring RR of the mask pattern M may be formed along the profile of the high etching area HEA. In the present example embodiment, the high etching area HEA may be substantially the same as the profile of the antenna 320, so that the profile of the recess ring RR may be substantially the same as the profile of the antenna 320.

For example, the thickness or the protrusion height h of the etch resistor layer 331 may be controlled by adjusting the thickness of the mask pattern M. In the present example embodiment, the mask pattern M may be formed to a thickness in range of about 30% to about 50% of the thickness of the protection layer 330, so that the depth of the recess ring RR may be in a range of about 30% to about 50% of the thickness of the protection layer 330. Accordingly, the thickness of the etch resistor 331 may have a thickness in a range of about 30% to about 50% of the thickness of the protection layer 330.

The etch resistor layer 331 may include materials having a sufficient etch resist to the high energy ions and particles of the plasma in the process space PS. In the present example embodiment, the etch resist layer 331 may have the same materials as the protection layer 330. Thus, both of the protection layer 330 and the etch resist layer 331 may have metal oxide such as yttrium oxide ($Y_2O_3$), zirconium oxide ($ZrO_2$), manganese oxide ($MnO_2$) and yttrium aluminum garnet ($Y_3Al_5O_2$).

Figure 7G:
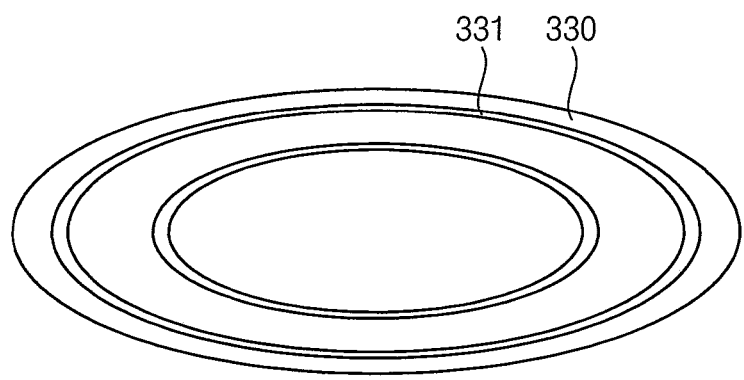
Figure 7H:
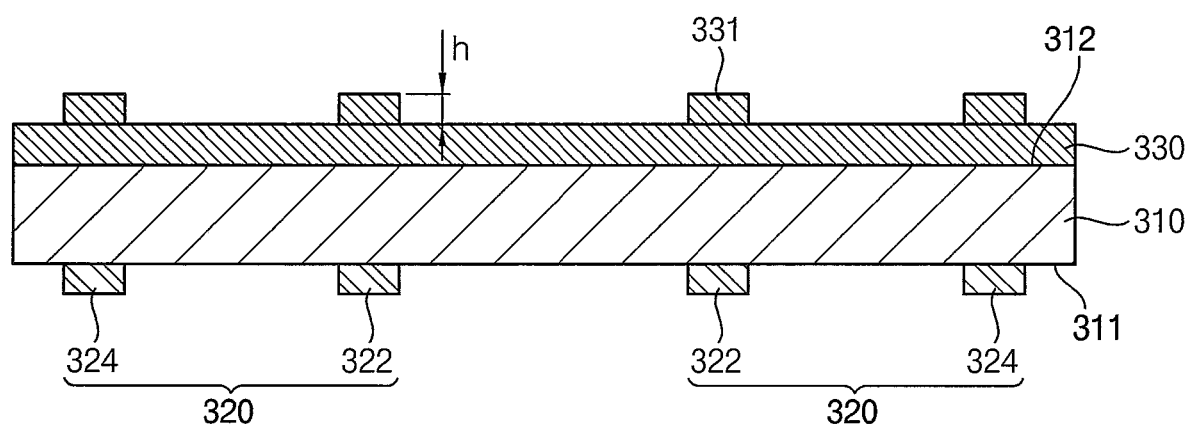

Referring to FIGS. 7G and 7H, the etch resist layer 331 may be partially removed from the mask pattern M by a planarization process until an upper surface of the mask pattern M may be exposed, to thereby form the etch resistor 331 filling in the recess ring RR.

For example, the planarization process may include at least one of a chemical mechanical polishing (CMP) process and an etch-back process. Thus, the etch resistor 331 may have a thickness corresponding to the depth of the recess ring RR.

Thereafter, the mask pattern M may be removed from the protection layer 330, and the etch resistor 331 may be arranged on the protection layer 330 in such a configuration that the etch resistor 331 may be protruded from the protection layer 330 along the high etching area HEA. Thus, the high etching area HEA of the protection layer 330 may be further protected from the high density plasma in the process space PS, and the body 310 corresponding to the high etching area HEA may be doubly protected from the high density plasma by both of the protection layer 330 and the etch resistor 331.

For example, the mask pattern M may be removed from the protection layer 330 by a wet etching process in which the etch resistance of the protection layer 330 may be greater than that of the mask pattern M.

Figure 7I:
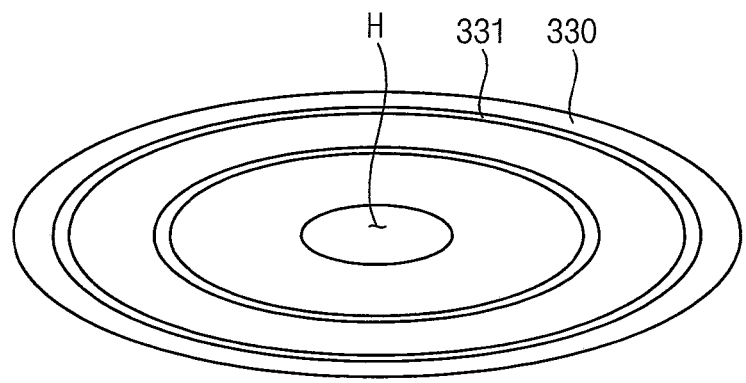
Figure 7J:
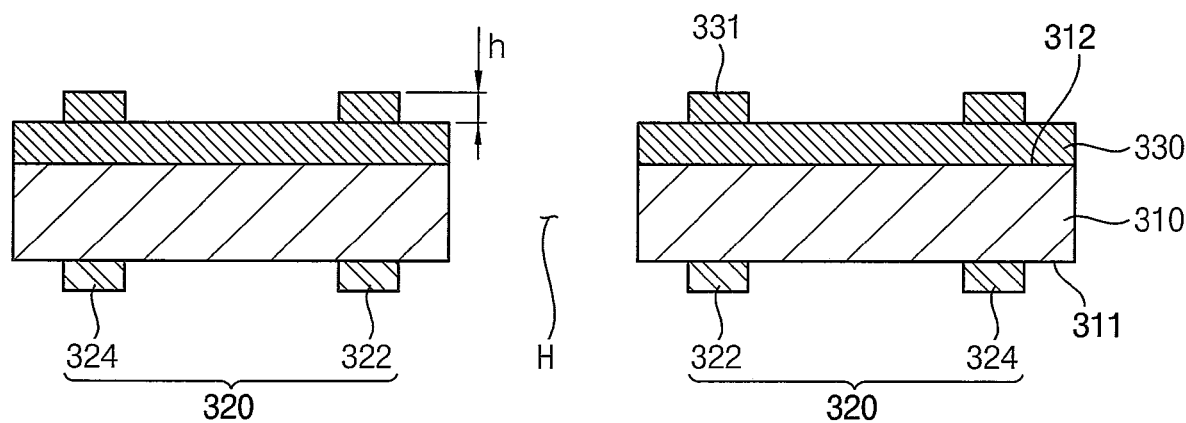

Referring to FIGS. 7I and 7J, the penetration hole H may be formed at a central portion of the body 310 and the protection layer 330. The gas supplier 400 may extend into the process space PS via the penetration hole H. For example, a high accuracy drilling process or a taping process may be conducted to the body 310 and the protection layer 330.

Accordingly, the source gases for the plasma may be directly supplied into the process space PS through the penetration hole H from an exterior source tank.

The etch resistor 331 may be formed on the protection layer 330 of the dielectric window 300 along the high etching area HEA to a sufficient thickness. Thus, when the dielectric window 300 may be combined with the process chamber of the plasma process, the body 310 of the dielectric window 300 may be sufficiently protected from the plasma although the high energy ions and particles of the plasma may be focused to the high etching area HEA of the protection layer 330. The etch resistor 331 may have a sufficient etch resistance to the high energy ions and particles, and thus the body 310 may be sufficiently prevented from being exposed in the plasma process.

When the profile of the high etching area HEA may be different from the profile of the antenna 320 due to the configurations and characteristics of the substrate treating apparatus 1000, the recess ring RR of the mask pattern M may be formed along the high etching area HEA, not along the antenna 320.

In a modified example embodiment, the etch resistor 331 may be directly formed on the high etching area HEA of the protection layer 330 by the printing process.

For example, the materials for the etch resistor 331 may be directly printed just on the high etching area HEA of the protection layer 330, so that the etch resistor 331 may be directly on the protection layer 330 without the mask pattern M. The thickness of the etch resistor 331 may be controlled just by the printing number of the printing process.

According to the example embodiments, the dielectric window for a plasma treating apparatus may include a protection layer covering a body of the dielectric window and an etch resistor arranged on the protection layer along a high etching area to which high energy ions and particles of plasma may focused due to self-bias. Therefore, although the plasma may be focused to the high etching area of the protection layer due to the self-bias, the body of the dielectric window may be protected from the plasma by both the etch resistor and the protection layer and thus the body of the dielectric window may be sufficiently prevented from being exposed to the process space.

Accordingly, contamination particles etched from the body of the dielectric window may be sufficiently prevented and process defects caused by the contamination particles may be sufficiently reduced in the plasma process.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A substrate treating apparatus, comprising:
a process chamber having a bottom portion configured to secure a substrate while a substrate treating process is performed on the substrate; and
a dielectric window arranged at an upper portion of the process chamber to define a process space, and including:
an insulative body,
an antenna disposed on an upper surface of the insulative body,
a protection layer disposed on a lower surface of the insulative body, and
a plurality of etch resistor which protrude from the protection layer in a first direction toward the process space, and which are spaced apart from each other in a second direction different from the first direction,
wherein each etch resistor of the plurality of etch resistors is arranged in an annular shape on the protection layer in a plan view, and is positioned between the antenna and the process space in the first direction, and
wherein the first direction is perpendicular to a radial direction of the annular shape.

2. The substrate treating apparatus of claim 1, wherein the insulative body includes at least one of alumina ($Al_2O_3$), quartz, silicon carbide (SiC), and resin, and
the protection layer includes a metal oxide.

3. The substrate treating apparatus of claim 2, wherein the metal oxide includes at least one of yttrium oxide ($Y_2O_3$), zirconium oxide ($ZrO_2$), manganese oxide ($MnO_2$) and yttrium aluminum garnet ($Y_3Al_5O_2$).

4. The substrate treating apparatus of claim 1, wherein a thickness of the plurality of the etch resistor is in a range of 30% to 50% of a thickness of the protection layer.

5. The substrate treating apparatus of claim 4, wherein the thickness of the protection layer is in a range of 10 μm to 20μm.

6. The substrate treating apparatus of claim 1, wherein the plurality of etch resistor has a protrusion height in a range of 5 μm to 10 μm.

7. The substrate treating apparatus of claim 1, wherein the each etch resistor of the plurality of etch resistors is shaped as one of a rectangle, a trapezoid and a concave semicircle in a cross-sectional view.

8. The substrate treating apparatus of claim 1, wherein the insulative body is shaped as a disk, and
wherein the antenna includes an inner coil arranged on a central portion of the insulative body and an outer coil arranged on a peripheral portion of the insulative body such that the outer coil is spaced apart from the inner coil in a radial direction of the insulative body.

9. The substrate treating apparatus of claim 8, wherein the plurality of etch resistor includes an inner resistor arranged on a central portion of the protection layer corresponding to the central portion of the insulative body, and an outer resistor arranged on a peripheral portion of the protection layer corresponding to the peripheral portion of the insulative body such that the outer resistor is spaced apart from the inner resistor in the radial direction of the insulative body.

10. The substrate treating apparatus of claim 8, wherein a plasma for the substrate treating process is focused on at least one of the plurality of etch resistors.

11. A substrate treating apparatus, comprising:
a process chamber configured to perform a substrate treating process on a substrate, and having a substrate holder in which a lower electrode is arranged and onto which the substrate is secured;
a dielectric window arranged at an upper portion of the process chamber to define a process space, and including:
an insulative body,
an upper electrode disposed on an upper surface of the insulative body,
a protection layer disposed on a lower surface of the insulative body, a plurality of etch resistors which protrude from the protection layer toward the process space in a first direction, and which are spaced apart from each other in a second direction different from the first direction, wherein the insulative body is protected from a plasma by the protection layer and the plurality of etch resistors;
a gas supplier configured to supply source gases into the process space through the process chamber and the dielectric window; and
a power supply configured to apply a high frequency power to the lower electrode and the upper electrode such that the source gases are changed into the plasma, and the plasma is guided towards the substrate in the process space,
wherein each etch resistor of the plurality of etch resistors is arranged in an annular shape on the protection layer in a plan view, and is positioned between the upper electrode and the process space in the first direction, and
wherein the first direction is perpendicular to a radial direction of the annular shape.

12. The substrate treating apparatus of claim 11, wherein the process chamber includes:
a lower housing having the upper portion blocked by the dielectric window, and having a bottom portion configured to receive the substrate holder, wherein the process space is provided between the dielectric window and the substrate holder, and
an upper housing detachably combined with the lower housing and configured to receive the dielectric window around the lower housing such that the dielectric window is detachably secured to both of the lower housing and the upper housing.

13. The substrate treating apparatus of claim 11, wherein the insulative body includes at least one of alumina ($Al_2O_3$), quartz, silicon carbide (SiC), and resin, and
wherein the protection layer includes at least one of yttrium oxide ($Y_2O_3$), zirconium oxide ($ZrO_2$), manganese oxide ($MnO_2$), and yttrium aluminum garnet ($Y_3Al_5O_2$).

14. The substrate treating apparatus of claim 11, wherein a thickness of the protection layer has is in a range of 10 μm to 20 μm, and
wherein a thickness of the etch resistor is in a range of 5 μm to 10 μm.

15. The substrate treating apparatus of claim 11, wherein the upper electrode includes an inner coil arranged on a central portion of the insulative body and an outer coil arranged on a peripheral portion of the insulative body such that the outer coil is spaced apart from the inner coil in a radial direction of the insulative body.

16. The substrate treating apparatus of claim 15, wherein the plurality of etch resistor are arranged corresponding to the upper electrode, and
wherein the plurality of etch resistors include an inner resistor arranged on a central portion of the protection layer corresponding to the central portion of the insulative body, and an outer resistor arranged on a peripheral portion of the protection layer corresponding to the peripheral portion of the insulative body, such that the outer resistor is spaced apart from the inner resistor in the radial direction of the insulative body.

17. The substrate treating apparatus of claim 11, wherein the plasma is focused on at least one of the plurality of etch resistors by a self-bias induced by the high frequency power that is applied to the upper electrode.

18. A substrate treating system, comprising:
a load port configured to receive a transfer pod holding a plurality of substrates;
a transfer module configured to select a substrate from among the plurality of substrates held in the transfer pod and transfer the selected substrate for a substrate treating process; and
a treating module connected to the transfer module and including a substrate treating apparatus in which the substrate treating process is performed on the selected substrate transferred from the transfer module,
wherein the substrate treating apparatus includes:
a process chamber configured to perform the substrate treating process on the selected substrate, and having a substrate holder in which a lower electrode is arranged and onto which the selected substrate is secured;
a dielectric window arranged at an upper portion of the process chamber to define a process space, and including an insulative body, an upper electrode disposed on an upper surface of the insulative body, a protection layer disposed on a lower surface of the insulative body, and a plurality of etch resistors which protrude from the protection layer in a first direction toward the process space, and which are spaced apart from each other in a second direction different from the first direction, wherein the insulative body is protected from a plasma by the protection layer and the plurality of etch resistors;
a gas supplier configured to supply source gases into the process space through the process chamber and the dielectric window; and
a power supply configured to apply a high frequency power to the lower electrode and the upper electrode such that the source gases are changed into the plasma and the plasma is guided towards the substrate in the process space,
wherein each etch resistor of the plurality of etch resistors is arranged in an annular shape on the protection layer in a plan view, and is positioned between the upper electrode and the process space in the first direction, and
wherein the first direction is perpendicular to a radial direction of the annular shape.

19. The substrate treating system of claim 18, wherein the insulative body is shaped as a disk and the upper electrode includes an inner coil arranged on a central portion of the insulative body and an outer coil arranged on a peripheral portion of the insulative body such that the outer coil is spaced apart from the inner coil in a radial direction of the insulative body, and wherein the plurality of etch resistor include an inner resistor arranged on a central portion of the protection layer corresponding to the central portion of the insulative body, and an outer resistor arranged on a peripheral portion of the protection layer corresponding to the peripheral portion of the insulative body such that the outer resistor is spaced apart from the inner resistor in the radial direction of the insulative body.

20. The substrate treating system of claim 18, wherein the plasma is focused on at least one of the plurality of etch resistors by a self-bias induced by the high frequency power that is applied to the upper electrode.

* * * * *